US009564296B2

(12) United States Patent
Kobayashi et al.

(10) Patent No.: US 9,564,296 B2
(45) Date of Patent: *Feb. 7, 2017

(54) RADIAL WAVEGUIDE SYSTEMS AND METHODS FOR POST-MATCH CONTROL OF MICROWAVES

(71) Applicant: Applied Materials, Inc., Santa Clara, CA (US)

(72) Inventors: Satoru Kobayashi, Santa Clara, CA (US); Soonam Park, Sunnyvale, CA (US); Dmitry Lubomirsky, Cupertino, CA (US); Hideo Sugai, Kasugai (JP)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/063,849

(22) Filed: Mar. 8, 2016

(65) Prior Publication Data

US 2016/0189933 A1 Jun. 30, 2016

Related U.S. Application Data

(63) Continuation of application No. 14/221,132, filed on Mar. 20, 2014, now Pat. No. 9,299,537.

(51) Int. Cl.
*H01J 7/24* (2006.01)
*H01J 37/32* (2006.01)
*H01J 37/244* (2006.01)

(52) U.S. Cl.
CPC ............ *H01J 37/32229* (2013.01); *H01J 7/24* (2013.01); *H01J 37/244* (2013.01);
(Continued)

(58) Field of Classification Search
CPC .............. H01J 7/24; H01J 19/80; H01J 37/32; H05B 41/16
(Continued)

(56) References Cited

U.S. PATENT DOCUMENTS 2,369,620 A 2/1945 Sullivan et al.
3,451,840 A 6/1969 Hough
(Continued)

FOREIGN PATENT DOCUMENTS

EP 1675160 A1 6/2006
JP H08-264510 A 10/1996
(Continued)

OTHER PUBLICATIONS

H. Xiao, Introduction to Semiconductor Manufacturing Technolooy, published by Prentice Hall, 2001, ISBN 0-13-022404-9, pp. 354-356.
(Continued)

*Primary Examiner* — Tung X Le
(74) *Attorney, Agent, or Firm* — Kilpatrick Townsend & Stockton LLP

(57) ABSTRACT

A system provides post-match control of microwaves in a radial waveguide. The system includes the radial waveguide, and a signal generator that provides first and second microwave signals that have a common frequency. The signal generator adjusts a phase offset between the first and second signals in response to a correction signal. The system also includes first and second electronics sets, each of which amplifies a respective one of the first and second microwave signals. The system transmits the amplified, first and second microwave signals into the radial waveguide, and matches an impedance of the amplified microwave signals to an impedance presented by the waveguide. The system also includes at least two monitoring antennas disposed within the waveguide. A signal controller receives analog signals from the monitoring antennas, determines the digital correction signal based at least on the analog signals, and transmits the correction signal to the signal generator.

20 Claims, 10 Drawing Sheets

(52) U.S. Cl.
CPC .... *H01J 37/3299* (2013.01); *H01J 37/32201* (2013.01); *H01J 37/32302* (2013.01); *H01J 37/32311* (2013.01); *H01J 37/32935* (2013.01)

(58) Field of Classification Search
USPC .......... 315/39, 248, 111.21, 111.31, 111.41, 315/111.51, 111.71; 118/723 E, 723 R, 118/728; 216/61, 68, 71
See application file for complete search history.

(56) References Cited

U.S. PATENT DOCUMENTS

| | | |
|---|---|---|
| 3,537,474 A | 11/1970 | Rohrer |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,904,621 A | 2/1990 | Loewenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,994,404 A | 2/1991 | Sheng et al. |
| 5,000,113 A | 3/1991 | Wang et al. |
| 5,006,192 A | 4/1991 | Deguchi |
| 5,013,691 A | 5/1991 | Lory et al. |
| 5,028,565 A | 7/1991 | Chang |
| 5,030,319 A | 7/1991 | Nishino et al. |
| 5,038,713 A * | 8/1991 | Kawakami .......... H05H 1/46 118/723 MA |
| 5,045,244 A | 9/1991 | Marlett |
| 5,061,838 A | 10/1991 | Lane et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,292,370 A | 3/1994 | Tsai et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |

(56) References Cited

U.S. PATENT DOCUMENTS

| | | |
|---|---|---|
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawili |
| 5,820,723 A | 10/1998 | Benjamin et al. |
| 5,824,599 A | 10/1998 | Schacham-Diamand et al. |
| 5,830,805 A | 11/1998 | Shacham-Diamand et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,074,512 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsiung et al. |

(56) References Cited

U.S. PATENT DOCUMENTS

| | | |
|---|---|---|
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson et al. |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |

(56) References Cited

U.S. PATENT DOCUMENTS

| | | |
|---|---|---|
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B1 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,364,956 B2 | 4/2008 | Saito |
| 7,365,016 B2 | 4/2008 | Ouellet et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 * | 10/2010 | Lee .................. A61L 2/14 118/723 MW |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,183,134 B2 | 5/2012 | Wu |
| 8,187,486 B1 | 5/2012 | Liu et al. |
| 8,211,808 B2 | 7/2012 | Sapre et al. |
| 8,272,346 B2 | 9/2012 | Bettencourt et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,652,298 B2 | 2/2014 | Dhindsa et al. |
| 8,679,982 B2 | 3/2014 | Wang et al. |
| 8,679,983 B2 | 3/2014 | Wang et al. |
| 8,702,902 B2 | 4/2014 | Blom et al. |
| 8,741,778 B2 | 6/2014 | Yang et al. |
| 8,747,680 B1 | 6/2014 | Deshpande |
| 8,765,574 B2 | 7/2014 | Zhang et al. |

(56) References Cited

U.S. PATENT DOCUMENTS

| | | |
|---|---|---|
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,869,742 B2 | 10/2014 | Dhindsa |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,786 B1 | 10/2015 | Purayath et al. |
| 9,184,055 B2 | 11/2015 | Wang et al. |
| 9,190,293 B2 | 11/2015 | Wang et al. |
| 9,190,302 B2 | 11/2015 | Ni |
| 9,209,012 B2 | 12/2015 | Chen et al. |
| 9,236,265 B2 | 1/2016 | Korolik et al. |
| 9,236,266 B2 | 1/2016 | Zhang et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0036706 A1 | 11/2001 | Kitamura |
| 2001/0037856 A1 | 11/2001 | Park |
| 2001/0037941 A1 | 11/2001 | Thompson |
| 2001/0041444 A1 | 11/2001 | Shields et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |

(56) References Cited

U.S. PATENT DOCUMENTS

| | | |
|---|---|---|
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0108068 A1 | 6/2004 | Senzaki et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0090078 A1* | 4/2005 | Ishihara ............ H01J 37/32192 438/471 |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0164479 A1 | 7/2005 | Perng et al. |
| 2005/0167394 A1 | 8/2005 | Liu et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0087644 A1 | 4/2006 | McMillin et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0210723 A1 | 9/2006 | Ishizaka |

(56) References Cited

U.S. PATENT DOCUMENTS

| | | |
|---|---|---|
| 2006/0216878 A1 | 9/2006 | Lee |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0025907 A1 | 2/2007 | Rezeq |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0281106 A1 | 12/2007 | Lubomirsky et al. |
| 2007/0287292 A1 | 12/2007 | Li et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fischer et al. |
| 2008/0102640 A1 | 5/2008 | Hassan et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2009/0317978 A1 | 12/2009 | Higashi |
| 2010/0003824 A1 | 1/2010 | Kadkhodayan et al. |
| 2010/0022030 A1 | 1/2010 | Ditizio |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0093151 A1 | 4/2010 | Arghavani et al. |
| 2010/0093168 A1 | 4/2010 | Naik |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0147219 A1 | 6/2010 | Hsieh et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |

(56) References Cited

U.S. PATENT DOCUMENTS

| | | |
|---|---|---|
| 2010/0207205 A1 | 8/2010 | Grebs et al. |
| 2010/0240205 A1 | 9/2010 | Son |
| 2010/0258913 A1 | 10/2010 | Lue |
| 2010/0294199 A1 | 11/2010 | Tran et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0143542 A1 | 6/2011 | Feurprier et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0103518 A1 | 5/2012 | Kakimoto |
| 2012/0104564 A1 | 5/2012 | Won et al. |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012032 A1 | 1/2013 | Liu et al. |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0089988 A1 | 4/2013 | Wang et al. |
| 2013/0098868 A1 | 4/2013 | Nishimura et al. |
| 2013/0105948 A1 | 5/2013 | Kewley |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0020708 A1 | 1/2014 | Kim et al. |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0199851 A1 | 7/2014 | Nemani et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege |

(56) References Cited

U.S. PATENT DOCUMENTS

| | | |
|---|---|---|
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0060265 A1 | 3/2015 | Cho et al. |
| 2015/0076110 A1 | 3/2015 | Wu et al. |
| 2015/0079797 A1 | 3/2015 | Chen et al. |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235809 A1 | 8/2015 | Ito et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0104606 A1 | 4/2016 | Park et al. |
| 2016/0118268 A1 | 4/2016 | Ingle et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0181112 A1 | 6/2016 | Xue et al. |

FOREIGN PATENT DOCUMENTS

| | | |
|---|---|---|
| JP | 2003-174020 A | 6/2003 |
| JP | 4763293 B2 | 8/2011 |
| JP | 2013-243418 A | 12/2013 |
| KR | 10-2009-0128913 A | 12/2009 |
| KR | 10-2011-0086540 A | 7/2011 |
| WO | 2009-084194 A1 | 7/2009 |

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.

* cited by examiner

RADIAL WAVEGUIDE SYSTEMS AND METHODS FOR POST-MATCH CONTROL OF MICROWAVES

CROSS-REFERENCE TO RELATED APPLICATIONS

This patent application is a continuation of, and claims the benefit of priority to, pending U.S. patent application Ser. No. 14/221,132, filed on Mar. 20, 2014, which is hereby incorporated by reference for all purposes.

TECHNICAL FIELD

The present disclosure is in the field of microwaves. More specifically, embodiments that utilize radial waveguides and associated control systems to provide control of microwaves in a plasma process chamber are disclosed.

BACKGROUND

Semiconductor processing often generates plasmas to create ionized and/or energetically excited species for interaction with semiconductor wafers themselves, or other processing related materials (e.g., photoresist). To create and/or maintain a plasma, one or more radio frequency (RF) and/or microwave generators are typically utilized to generate oscillating electric and/or magnetic fields. The same fields, and/or DC fields, may also be utilized to direct the ionized and/or energetically excited species to the semiconductor wafer(s) being processed. Various known methods are often utilized to match an impedance of a power source (the RF generator) to a load (the plasma) so that power from the RF generator is delivered to the plasma without significant reflection of power back to the RF generator. This is for reasons of energy efficiency as well as to protect electrical components of the RF generator from damage. Particularly when microwave energy is utilized, reflected power is usually directed to a dummy load where it is dissipated as heat, which must then be removed. Thus, reflected power results in a two-fold waste of energy: the energy utilized to generate the power, and the energy utilized to remove the waste heat.

SUMMARY

In an embodiment, a system provides post-match control of microwaves in a radial waveguide. The system includes the radial waveguide and a signal generator that provides a first microwave signal and a second microwave signal. The first and second microwave signals have a common frequency. The signal generator adjusts a phase offset between the first and second microwave signals in response to a digital correction signal. The system also includes a first electronics set and a second electronics set. Each of the first and second electronics sets amplifies a respective one of the first and second microwave signals to provide a respective first or second amplified microwave signal, transmits the respective first or second amplified microwave signal into the radial waveguide, and matches an impedance of the respective first or second amplified microwave signal to an impedance presented by the radial waveguide. The system also includes at least two monitoring antennas disposed at least 30 degrees about a circumference of the radial waveguide from locations at which the first and second electronics sets transmit the respective first and second amplified microwave signals into the radial waveguide. A signal controller receives analog signals from the at least two monitoring antennas, determines the digital correction signal based at least on the analog signals from the at least two monitoring antennas, and transmits the digital correction signal to the signal generator.

In an embodiment, a system for plasma processing of a workpiece includes a process chamber configured to create a plasma for the plasma processing, and a radial waveguide, adjacent to the process chamber, configured to generate microwaves for transmission to the process chamber to supply energy for the plasma. The system also includes a signal generator that provides a first microwave signal and a second microwave signal, the first and second microwave signals having a common frequency. The signal generator adjusts a phase offset between the first and second microwave signals in response to a digital correction signal. The system also includes a first electronics set and a second electronics set. Each of the first and second electronics sets amplifies a respective one of the first and second microwave signals to provide an amplified microwave signal, transmits the amplified microwave signal into the radial waveguide, and matches an impedance of the amplified microwave signal to an impedance presented by the radial waveguide. The system also includes at least two monitoring antennas disposed at least 30 degrees about a circumference of the radial waveguide from locations at which the first and second electronics sets transmit the respective first and second amplified microwave signals into the radial waveguide. A signal controller receives analog signals from the at least two monitoring antennas, determines the digital correction signal based at least on the analog signals from the at least two monitoring antennas, and transmits the digital correction signal to the signal generator. The first electronics set includes a tuner that matches the impedance of the first amplified microwave signal to the impedance presented by the radial waveguide, a dummy load, and a circulator that shunts power reflected back from the radial waveguide toward the first electronics set, into the dummy load. The signal generator adjusts the phase offset, and the tuner matches the impedance, concurrently with one another.

In an embodiment, a method for controlling a plasma within a process chamber includes generating, with a signal generator, a first microwave signal and a second microwave signal, the first and second microwave signals having a common frequency and a phase offset therebetween that is determined at least in part by the singal generator responding to a digital correction signal. The method also includes amplifying the first and second microwave signals to provide respective first and second amplified microwave signals, and transmitting the first and second amplified microwave signals into a radial waveguide proximate the process chamber such that microwaves propagate from the radial waveguide into the process chamber to provide energy for the plasma. The method also includes generating analog signals with at least two monitoring antennas disposed at least 30 degrees about a circumference of the radial waveguide from locations at which the first and second electronics sets transmit the respective first and second amplified microwave signals into the radial waveguide, determining the digital correction signal based at least on the analog signals from the at least two monitoring antennas, and transmitting the digital correction signal to the signal generator.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

The present disclosure may be understood by reference to the following detailed description taken in conjunction with the drawings briefly described below, wherein like reference numerals are used throughout the several drawings to refer to similar components. It is noted that, for purposes of illustrative clarity, certain elements in the drawings may not be drawn to scale. Specific instances of an item may be referred to by use of a numeral in parentheses (e.g., monitoring antennas 311(1), 311(2)) while numerals without parentheses refer to any such item (e.g., monitoring antennas 311). In instances where multiple instances of an item are shown, only some of the instances may be labeled, for clarity of illustration.

DETAILED DESCRIPTION

Figure 1:
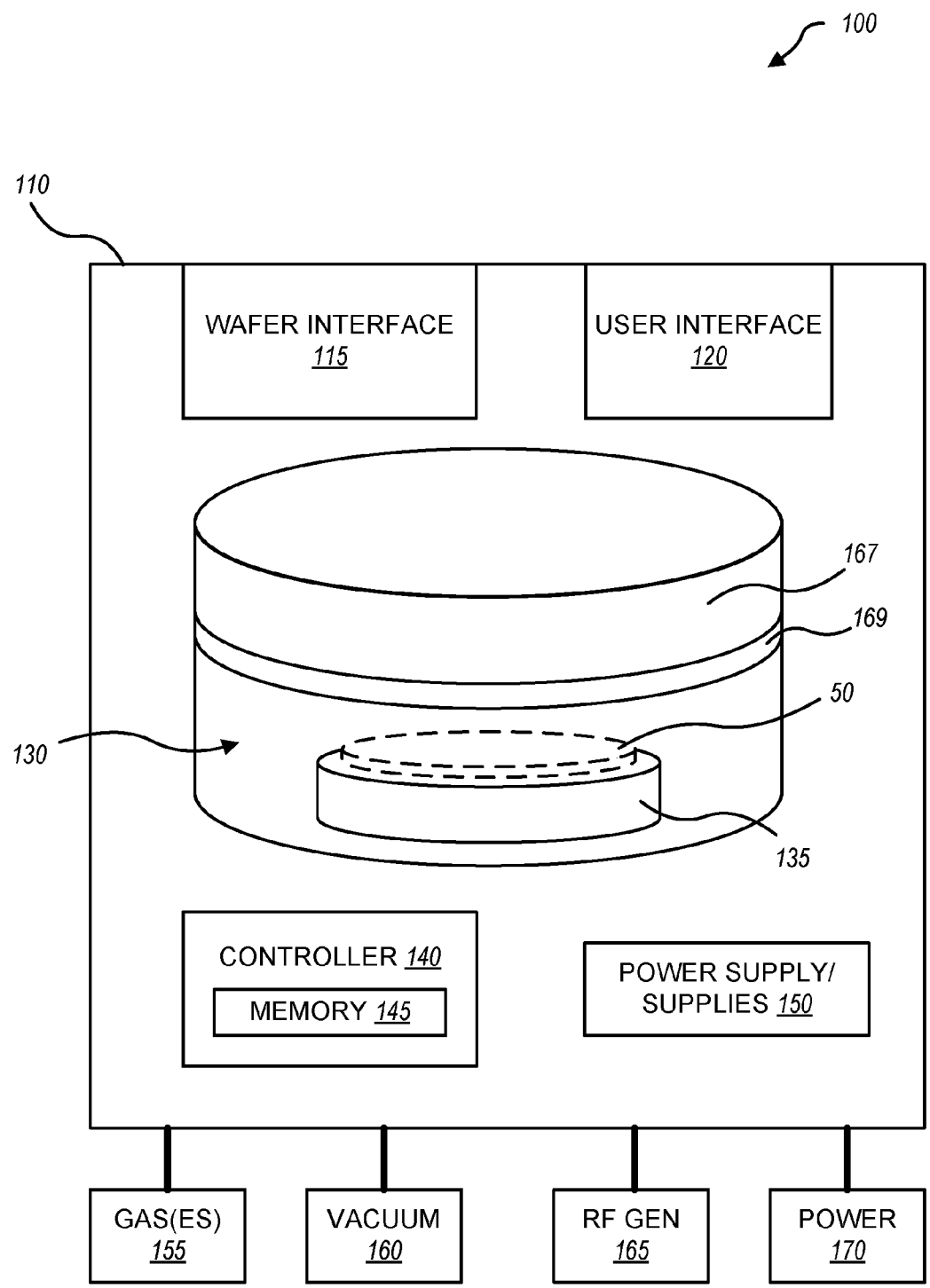
FIG. 1 schematically illustrates major elements of a single wafer, semiconductor wafer processing system, according to an embodiment.

FIG. 1 schematically illustrates major elements of a plasma processing system 100, according to an embodiment. System 100 is depicted as a single wafer, semiconductor wafer processing system, but it will be apparent to one skilled in the art that the techniques and principles herein are applicable to a plasma processing system for any type of workpiece (e.g., items that are not necessarily wafers or semiconductors). Processing system 100 includes a housing 110 for a wafer interface 115, a user interface 120, a process chamber 130, a controller 140 and one or more power supplies 150. Process chamber 130 includes one or more wafer pedestals 135, upon which wafer interface 115 can place a workpiece 50 (e.g., a wafer, but could be a different type of workpiece) for processing. A radio frequency generator (RF Gen) 165 supplies power to create a plasma within process chamber 130. Specifically, RF Gen 165 powers a radial waveguide 167 that may be disposed above or below process chamber 130, and is shown in FIG. 2 as above chamber 130. Process chamber 130 is proximate radial waveguide 167, and is bounded adjacent to radial waveguide 167 by a plate 169 that is formed of a material that is permeable to electromagnetic fields but not to air or process gases utilized in chamber 130. Thus, plate 169 can support a pressure difference between radial waveguide 167 and chamber 130, while allowing microwaves within radial waveguide 167 to propagate into chamber 130. Plate 169 may be formed, for example, of ceramic. The elements shown as part of system 100 are listed by way of example and are not exhaustive. Many other possible elements, such as: pressure and/or flow controllers; electrodes, magnetic cores and/or other electromagnetic apparatus; mechanical, pressure, temperature, chemical, optical and/or electronic sensors; viewing and/or other access ports; and the like may also be included, but are not shown for clarity of illustration. Internal connections and cooperation of the elements shown within system 100 are also not shown for clarity of illustration. In addition to RF generator 165, other representative utilities such as gases 155, vacuum pumps 160, and/or general purpose electrical power 170 may connect with system 100. Like the elements shown in system 100, the utilities shown as connected with system 100 are intended as illustrative rather than exhaustive; other types of utilities such as heating or cooling fluids, pressurized air, network capabilities, waste disposal systems and the like may also be connected with system 100, but are not shown for clarity of illustration.

Figure 2A:
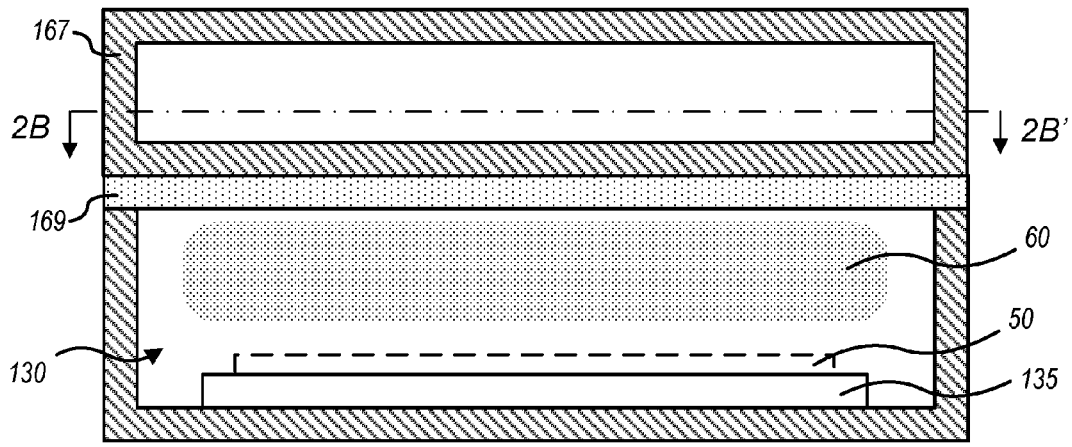
FIGS. 2A and 2B are schematic cross-sections illustrating selected structure of a radial waveguide and a process chamber of the single wafer, semiconductor wafer processing system of FIG. 1.
Figure 2B:
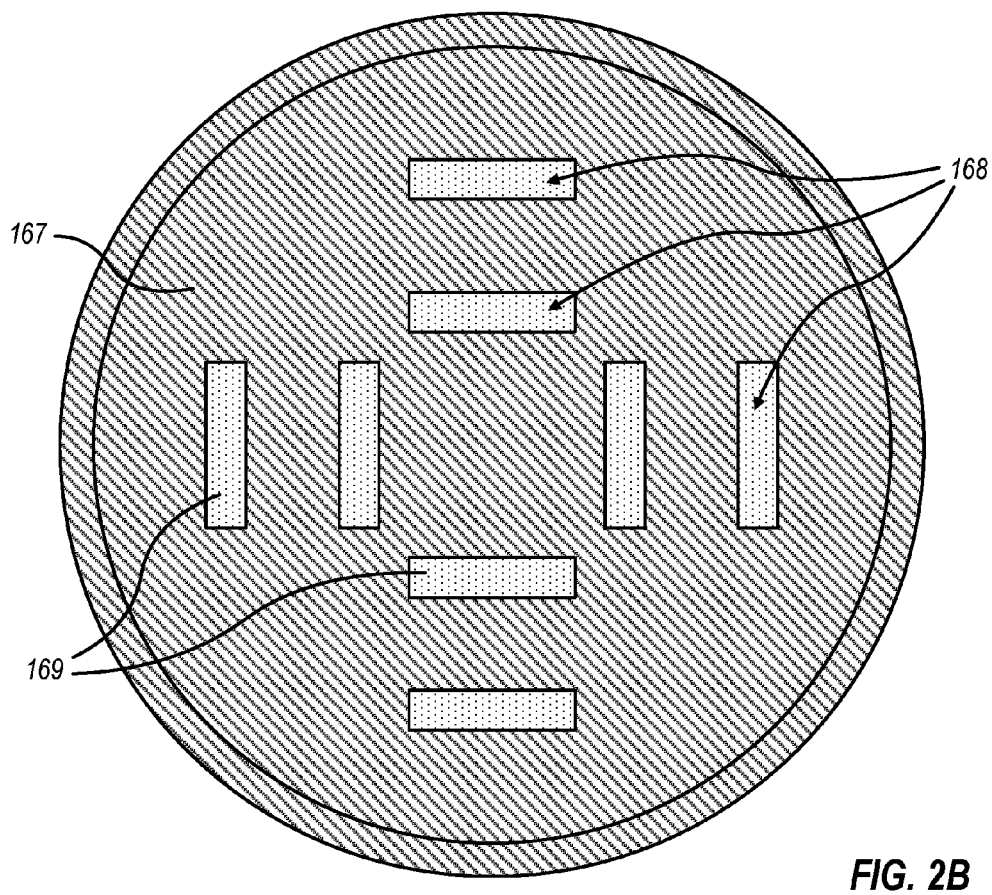

FIGS. 2A and 2B are schematic cross-sections illustrating selected structure of radial waveguide 167 and process chamber 130, FIG. 1. FIG. 2A is a vertical cross-section of radial waveguide 167, process chamber 130 and a workpiece 50 therein. A broken line 2B-2B' indicates a further cross-sectional view illustrated in FIG. 2B. Radial waveguide 167 is a substantially cylindrical and closed shape, except for slots 168 formed in an undersurface thereof that allow microwaves to propagate into process chamber 130, ports for providing and/or measuring microwaves, and other minor penetrations (such ports and penetrations are not shown in FIGS. 2A/2B). Slots 168 may for example form a radial line slot antenna. Process chamber 130 is substantially radially symmetric along a common axis with radial waveguide 129. Microwaves propagate from radial waveguide 167 into process chamber 130 through slots 168 and through plate 169 to provide energy for igniting and/or maintaining plasma 60. Pedestal 135 is configured to present a workpiece 50 to plasma 60 for processing. Process chamber 130 may include ports and/or mechanical openings (not shown) for insertion and/or withdrawal of workpiece 50, introduction of gases to form plasma 60, removal of plasma and gaseous reaction products, sensors, viewing and the like.

Figure 3:
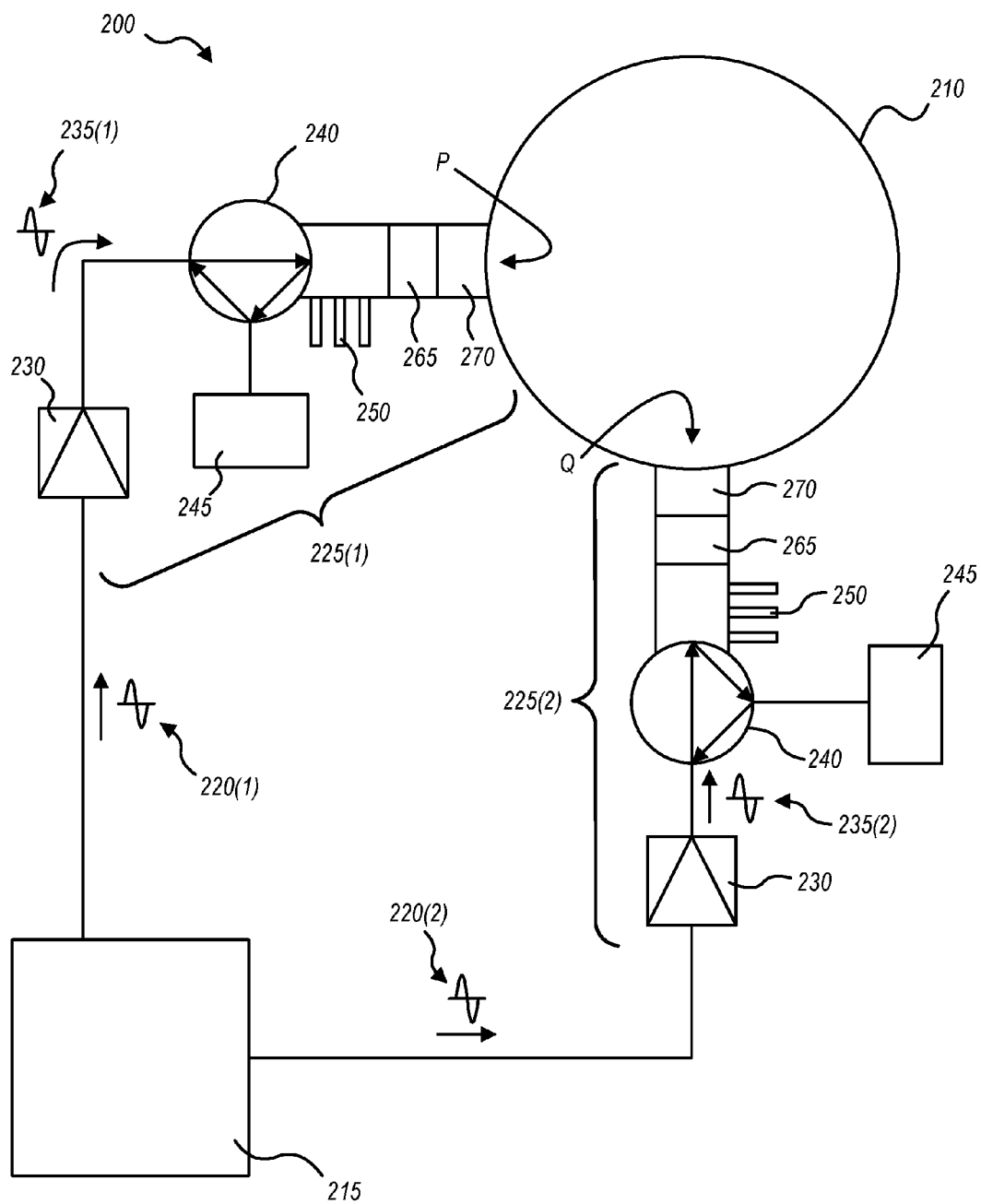
FIG. 3 is a schematic diagram of major components of a system for providing microwaves to a plasma chamber utilizing a radial waveguide, in an embodiment.

FIG. 3 is a schematic diagram of major components of a system 200 for providing microwaves to a plasma chamber utilizing a radial waveguide, in an embodiment. A radial waveguide 210 of system 200 may be utilized for example as radial waveguide 167, FIG. 1. In general, system 200 powers radial waveguide 210 at two locations noted as P and Q in FIG. 3, with locations P and Q being driven roughly π/2 out of phase with one another by electronics sets 225(1), 225(2) described below. Radial waveguide 210 is thus considered a "dual driven" radial waveguide; the dual driven mode of operation provides high microwave energy density derived from two sets of driving electronics rather than a single set operating at double the power. Use of two (or more) sets of driving electronics, each operating at lower power than a single set at high power, may be advantageous. An electronics set operating at higher power may require components having higher voltage, current, or heat dissipation ratings that may be much more expensive or difficult to obtain than components for lower power sets. For example, microwave field effect transistors (FETs) of low cost and high quality have recently become available for use in electronics sets 225 herein, but high voltage, current, and/or power dissipation versions of such FETs may remain costly or difficult to obtain.

Operation of system 200 is best understood as starting with a dual phase signal generator 215 that provides two microwave signals 220(1), 220(2) that are at the same frequency, but are $\pi/2$ out of phase with one another. Microwave signals 220(1), 220(2) drive circuits that are referred to as a first set 225(1) and a second set 225(2). Each set 225(1), 225(2) begins with a solid state amplifier 230 that boosts the power of respective microwave signals 220(1), 220(2) to create amplified microwave signals 235(1), 235(2). Solid state amplifiers 230 may include one or more microwave FETs, as discussed above. Each amplified microwave signal 235(1), 235(2) passes into and through a circulator 240 that serves to protect the respective solid state amplifiers 230 from power reflections from radial waveguide 210. Circulators 240 thus pass input power from solid state amplifiers 230 into respective tuners 250, while shunting any power that is reflected back into dummy loads 245.

Tuners 250 adjust impedance seen by the amplified microwave signals 235(1), 235(2) so as to match an impedance presented by components such as converters 255, radial waveguide 260 and an adjacent process chamber (e.g., process chamber 130, FIG. 1, not shown in FIG. 3). Tuners 250 may be, for example, three-pole stub tuners. The amplified, tuned signals then pass through respective coaxial-to-waveguide converters 265 and into radial waveguide 210 at respective waveguides with radiating apertures 270.

As part of the tuning required to achieve acceptable impedance matching, tuners 250 can change the phase of signals passed toward radial waveguide 210, such that although the signals are supplied at positions that are exactly $\pi/2$ out of phase around the circumference of radial waveguide 210, the signals themselves may no longer be exactly $\pi/2$ out of phase. That is, instead of exciting a symmetric, circular polarization mode in radial waveguide 210, an asymmetric, ellipsoidally polarized mode may be excited. This asymmetry in the microwave configuration can lead, in turn, to process aberrations in an adjacent process chamber. For example, an asymmetric microwave configuration can lead to a correspondingly asymmetric plasma and consequently to local skews in depth of plasma etching.

Embodiments herein recognize that as wafer sizes grow larger and the geometries produced in semiconductor fabrication grow smaller, the need for uniformity control of all aspects of the processing environment around the wafer increases. Therefore, embodiments herein adjust the microwave configuration that generates the plasma, not only to match impedance, but also to adjust phase and/or amplitude after impedance is matched, for improved symmetry of the plasma generated around the wafer. Even when careful attention is paid to symmetry of a process chamber, placement of a wafer in the process chamber, and the like, asymmetries in a plasma can arise from many causes (e.g., mechanically asymmetric ports, sensors, wafer placement, wafer flats, cabling length and the like) such that control of phase and/or amplitude, in addition to impedance matching, may provide an extra and useful degree of freedom for improving uniformity in plasma processing.

Figure 4:
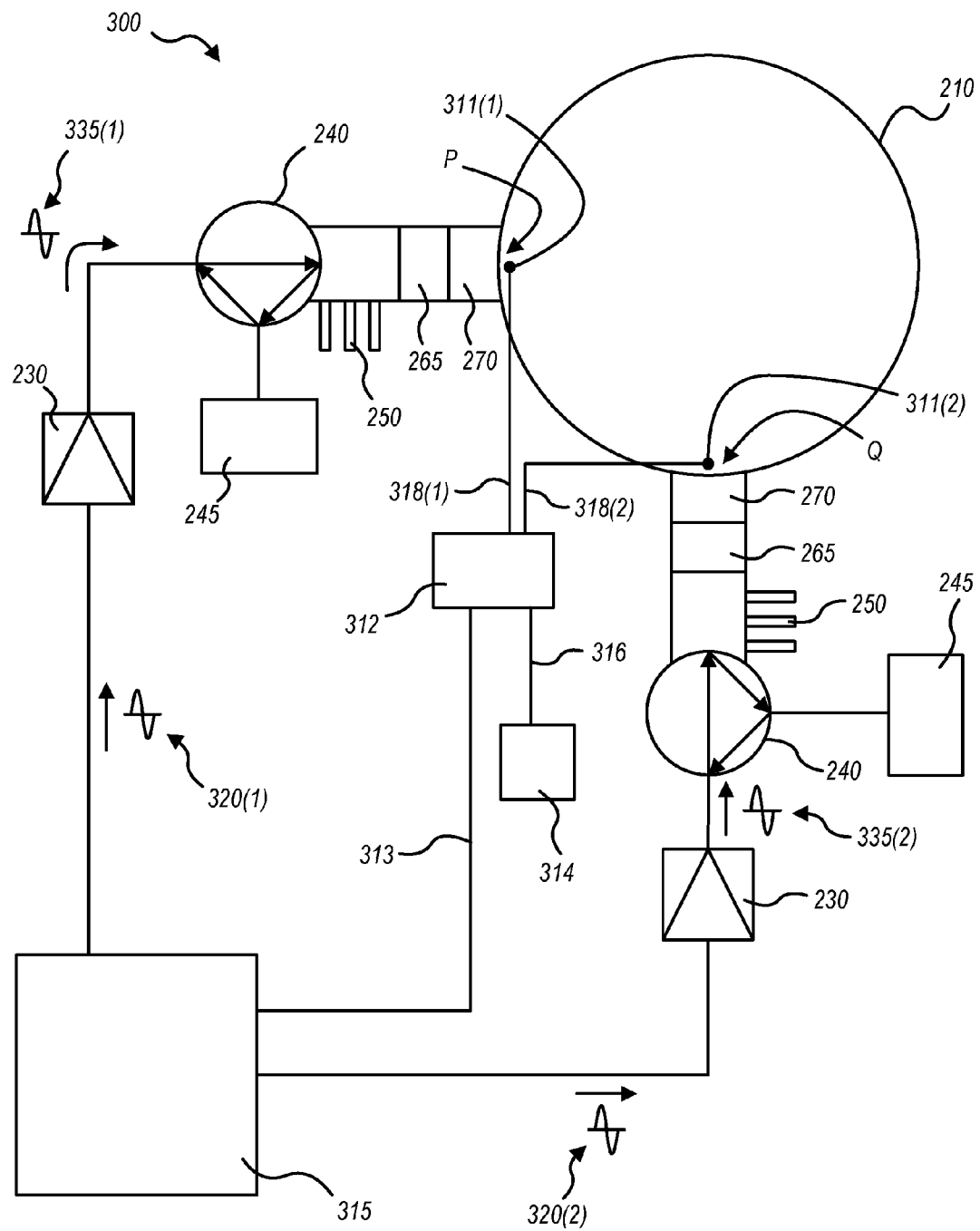
FIG. 4 is a schematic diagram of major components of a system that provides post-match control of microwaves in a radial waveguide, in an embodiment.

FIG. 4 is a schematic diagram of major components of a system 300 that provides post-match control of microwaves in a radial waveguide, in an embodiment. System 300 may be utilized to excite a plasma in an adjacent plasma chamber. In general, system 300 has many of the same components as, and works similarly to, system 200 (FIG. 3). However, system 300 independently adjusts amplitude of, and/or a phase offset between, microwave signals 320(1) and 320(2) to control phase at points P and Q, for example to be utilized as a degree of freedom for optimizing process uniformity.

In system 300, a radial waveguide 210 may be utilized for example as radial waveguide 167, FIG. 1. System 300 powers radial waveguide at two locations noted as P and Q in FIG. 1, with locations P and Q being driven roughly $\pi/2$ out of phase with one another. Like system 200, operation of system 300 can be understood starting with a dual phase signal generator 315 that provides microwave signals 320(1), 320(2) that are at the same frequency. However, dual phase signal generator 315 receives a correction signal 313 from a signal controller 312 that provides information for adjustment of signals 320(1), 320(2). For example, correction signal 313 may direct dual phase signal generator 315 to provide a corrected or targeted phase offset between microwave signals 320(1), 320(2). Thus, in system 300, microwave signals 320(1), 320(2) may be out of phase with one another by $\pi/2$, or by $\pi/2$ plus or minus the target phase difference, such that a measured phase difference at points P and Q is as intended, as discussed below. In another example, correction signal 313 may direct dual phase signal generator 315 to boost and/or attenuate one or both of microwave signals 320(1), 320(2).

At this point, it should be noted that signal generator 315 is termed a "dual phase signal generator" herein, but considering that other embodiments may be driven at more than two points by a signal generator that generates more than two signals of identical frequency and differing phase (see, e.g., FIG. 8) it is understood that the "dual phase" aspect is for convenient reference. Furthermore, in embodiments, signal generator 315 may control amplitude of signals 320, as well as phase thereof. Thus, dual phase signal generator 315 is simply a specific case of a "signal generator" as discussed elsewhere herein.

Like system 200, microwave signals 320(1), 320(2) drive respective solid state amplifiers 230 that boost power to create amplified microwave signals 335(1), 335(2), which in turn pass into and through circulators 240. Circulators 240 pass amplified microwave signals 335(1), 335(2) into respective tuners 250 while shunting any power reflected back into dummy loads 245. Tuners 250 adjust impedance seen by the amplified microwave signals 335(1), 335(2) so as to match an impedance presented by components such as converters 255, radial waveguide 260 and an adjacent process chamber (e.g., process chamber 130, FIG. 1, not shown in FIG. 4). The amplified, tuned signals then pass through respective coaxial-to-waveguide converters 265 and into radial waveguide 210 at respective waveguides with radiating apertures 270.

Monitoring antennas 311(1) and 311(2), disposed proximate to points P and Q respectively, provide analog signals to signal controller 312 through their respective connections 318(1) and 318(2), capturing any phase offset introduced by tuners 250. Monitoring antennas 311 may monitor either an electrical field or a magnetic field component of microwaves in radial waveguide 210. When electrical fields are monitored, it is appreciated that metal of radial waveguide 210 may reduce electrical fields in close proximity thereto, such that care should be taken to locate monitoring antennas 311 far enough from radial waveguide 210 to provide sufficient sensitivity. Signal controller 312 receives signals from monitoring antennas 311(1) and 311(2) through their respective connections 318(1) and 318(2) and determines amplitude of, and a phase offset between, signals at points P and Q. For example, signal controller 312 may perform in-phase and quadrature-phase demodulation (IQ demodulation) to measure amplitude and phase offset of the signals from monitoring antennas 311(1) and 311(2) (see also FIG. 9). Signal controller 312 then utilizes the measured phase offset and/or amplitudes to calculate and provide a corresponding digital correction signal 313 to dual phase signal generator 315. Digital correction signal 313 may be chosen to be a desired phase offset (e.g., a value of $\pi/2$) or an offset from an assumed, desired phase difference (e.g., a correction factor that is zero when the desired phase difference is attained). Alternatively, digital correction signal may be chosen to adjust amplitude of one or both of microwave signals 320(1), 320(2). Dual phase signal generator 315 then provides microwave signals 320(1) and 320(2) with a phase offset and/or amplitudes such that when the microwave signals propagate through the system, the phase offset between points P and Q is driven to the desired phase difference, and/or the amplitudes measured at points P and Q are as desired.

Optionally, a target input device 314 may provide one or more target parameters 316 to signal controller 312. Target input device 314 may be implemented in a variety of ways, such as by physical switches providing an output that is received directly by signal controller 312, or as a part of system management hardware and software that acquires the target parameters from a user interface (e.g., a keyboard, other buttons, or a graphical user interface (GUI)). Target parameters 316 may include, for example, a desired phase difference as measured at monitoring antennas 311(1) and 311(2), or amplitude adjustments to either or both of microwaves driven into radial waveguide 210. Target parameters 316 can be utilized by signal controller 312 along with the analog signals from monitoring antennas 311(1) and 311(2), to generate digital correction signal 313. For example, when a target phase difference is utilized, digital correction signal 313 may be generated first based on the signals from monitoring antennas 311(1) and 312(1), after which digital correction signal 313 may be adjusted by adding or subtracting target parameter 316. Once digital correction signal 313 is transmitted, dual phase signal generator 315 provides signals 320(1) and 320(2) with a corresponding offset until the phase offset between points P and Q is driven according to the target parameter, and digital correction signal 313 is driven to its target value, or zero. In another example, when a target amplitude adjustment is utilized, dual phase signal generator 315 can adjust amplitude of either or both of signals 320(1), 320(2) in response thereto.

Optional target input device 314 provides a useful, independent degree of freedom for optimizing a semiconductor processing system that includes system 300 or other systems with a similar capability, as disclosed herein. For example, the corresponding semiconductor processing system may be optimized by processing (e.g., etching) wafers, which may have test patterns printed thereon. Each wafer could be processed with identical processing parameters except for a different target parameter entered into target input device 314. The performance of the system could be evaluated by measurements of the wafers that are indicative of performance of the etch system (e.g., etch rate, selectivity, linewidth change due to etch, and the like) as well as system monitors (e.g., system stabilization times, endpoint detection parameters, etc.) An optimized value of the target parameter could then be selected, based on the wafer measurements, the system monitors and/or a combination thereof.

It will be understood by one skilled in the art that while signal controller 312 cooperates with dual phase signal generator 315 to adjust phase of microwave signals 320(1) and 320(2), tuners 250 also continue to adjust impedance matching to minimize reflected power. Thus, system 300 does not sacrifice impedance matching, but rather provides the additional capability of phase and/or amplitude adjustment for the dual driven radial waveguide, to optimize plasma symmetry in an adjacent process chamber. That is, in embodiments, signal generator 315 adjusts the phase offset, and tuners 250 provide the impedance matching, concurrently with one another during the operation of system 300. In other embodiments, signal generator 315 adjusts the amplitude, and tuners 250 provide the impedance matching, concurrently with one another during the operation of system 300.

Figure 5:
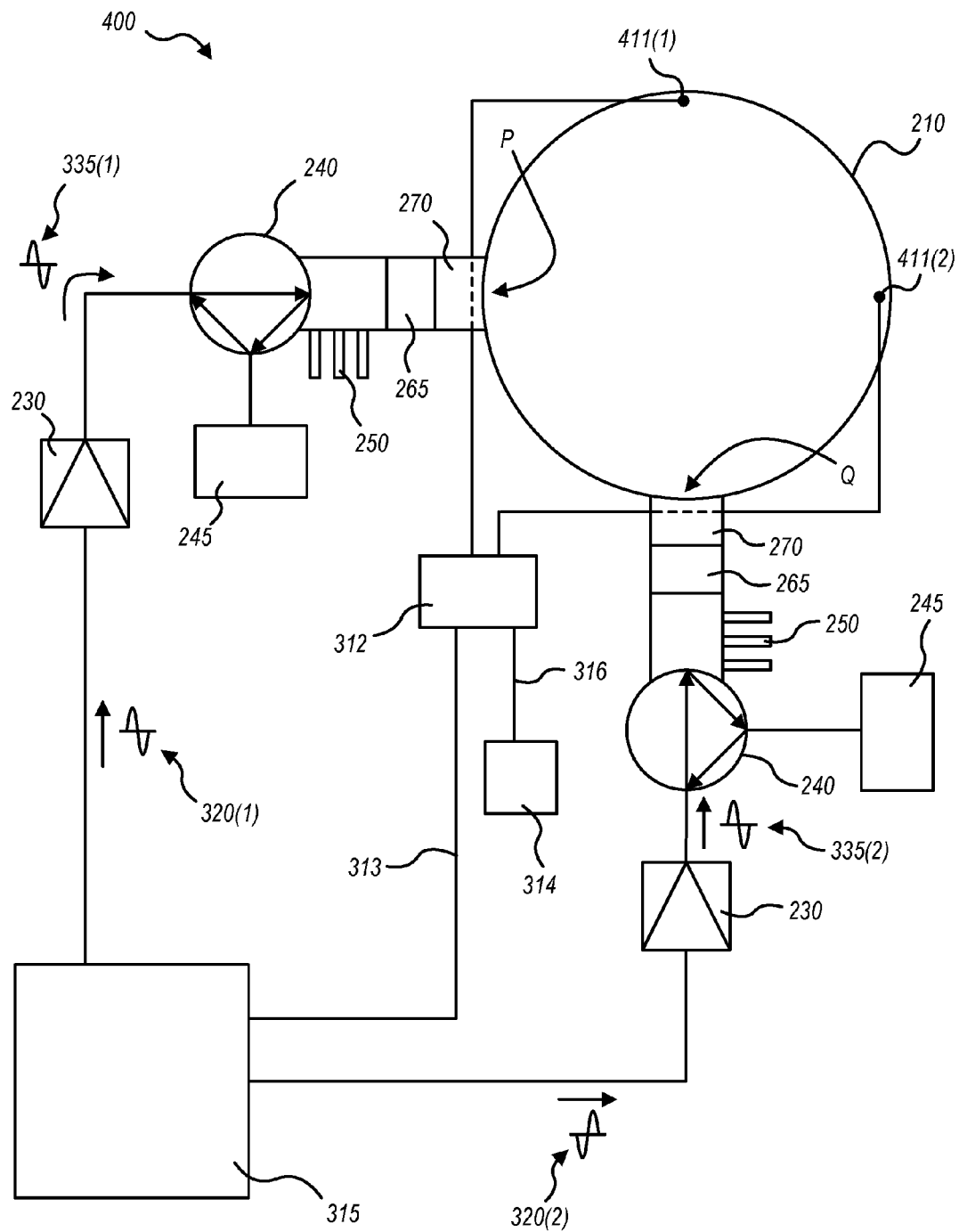
FIG. 5 is a schematic diagram of major components of a system that provides post-match control of microwaves in a radial waveguide, in an embodiment.

FIG. 5 is a schematic diagram of major components of a system 400 that provides post-match control of microwaves in a radial waveguide, in an embodiment. System 400 may be utilized to excite a plasma in an adjacent plasma chamber. In general, system 400 has many of the same components as, and works similarly to, systems 200 (FIG. 3) and 300 (FIG. 4). However, system 400 places monitoring antennas 411(1) and 411(2) at locations that are 180 degrees across radial waveguide 210 from points P and Q. The locations of monitoring antennas 411(1) and 411(2) may enable the signals returned to signal controller 312 to include effects of radial waveguide 210 that are not readily monitored by monitoring antennas located at points P and Q (e.g., like monitoring antennas 311, FIG. 4). That is, in system 300, monitoring antennas 311(1) and 311(2) will receive very strong signals directly from waveguides with radiating apertures 270 such that effects introduced by other features (e.g., minor asymmetries) of radial waveguide 210, and/or feedback effects from an adjacent plasma chamber, may not have much effect on the received signals. Placing monitoring antennas 411(1) and 411(2) at points within radial waveguide 210 that are distant from points P and Q (for example, points that are at least 30 degrees offset from points P and/or Q) increases the usefulness of the phase match capabilities of system 400 by including such effects. Those skilled in the art will appreciate that placing monitoring antennas 411(1) and 411(2) 180 degrees across radial waveguide 210 from points P and Q respectively may simplify calculation of digital correction signal 313 (e.g., signals expected when monitoring antennas 411(1) and 411(2) are 180 degrees across radial waveguide 210 from points P and Q leads to the expectation that phase of signals detected thereby will be it out of phase with the respective signals at points P and Q).

Figure 6:
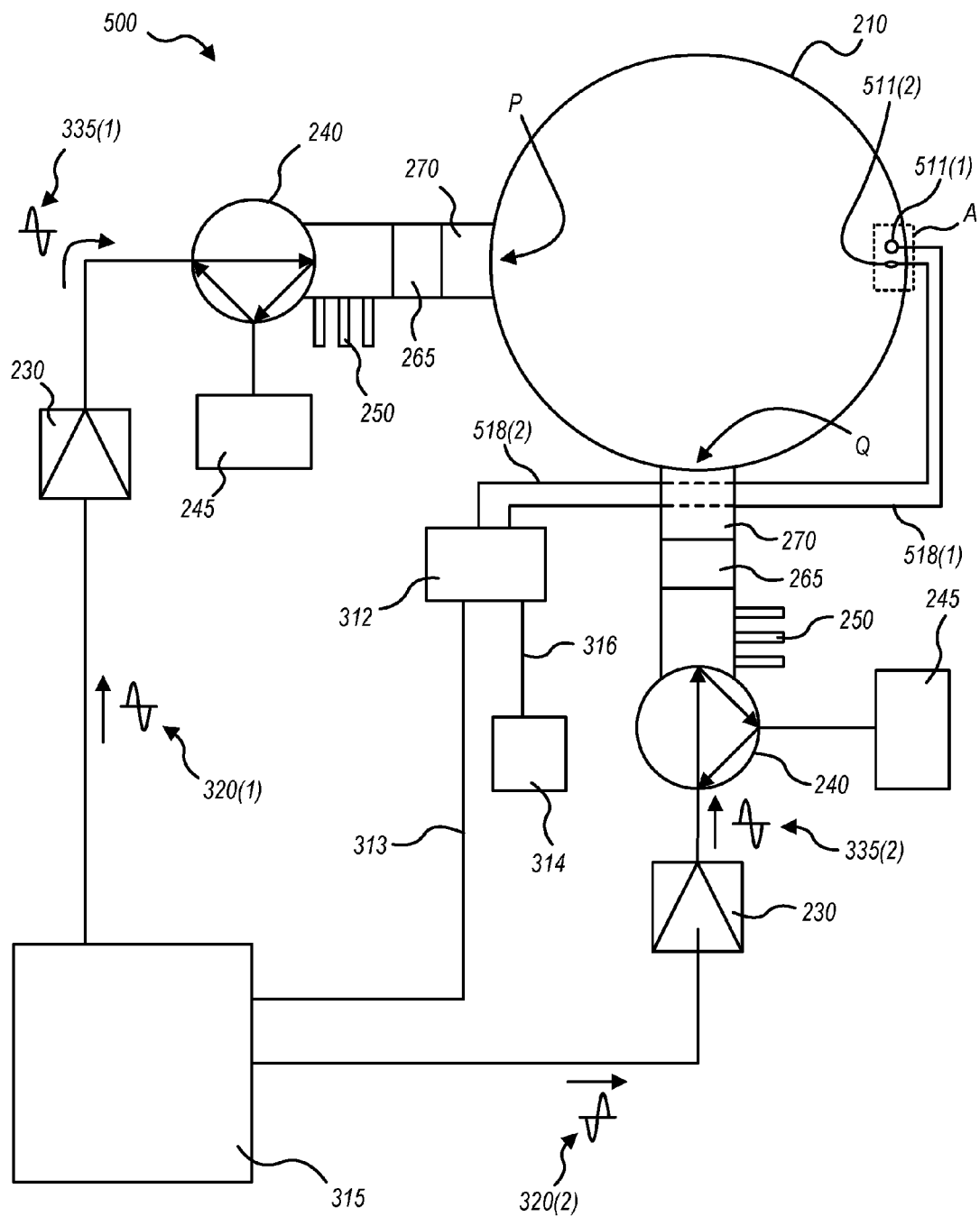
FIG. 6 is a schematic diagram of major components of a system that provides post-match control of microwaves in a radial waveguide, in an embodiment.

FIG. 6 is a schematic diagram of major components of a system 500 that provides post-match control of microwaves in a radial waveguide, in an embodiment. System 500 may be utilized to excite a plasma in an adjacent plasma chamber. In general, system 500 has many of the same components as, and works similarly to, systems 200, 300 and 400 (FIGS. 3-5). However, system 500 includes monitoring antennas 511(1) and 511(2) that measure independent components of magnetic fields, $H_z$ and $H_\theta$ respectively. Monitoring antennas 511(1) and 511(2) are shown at a region A that is across radial waveguide 210 from point P, as shown in FIG. 6, but because antennas 511(1) and 511(2) provide signals that relate to magnetic field components $H_z$ and $H_\theta$ that are independent of one another, they may be located at other locations and still provide phase offset information that is useful for providing post-match control.

Figure 7:
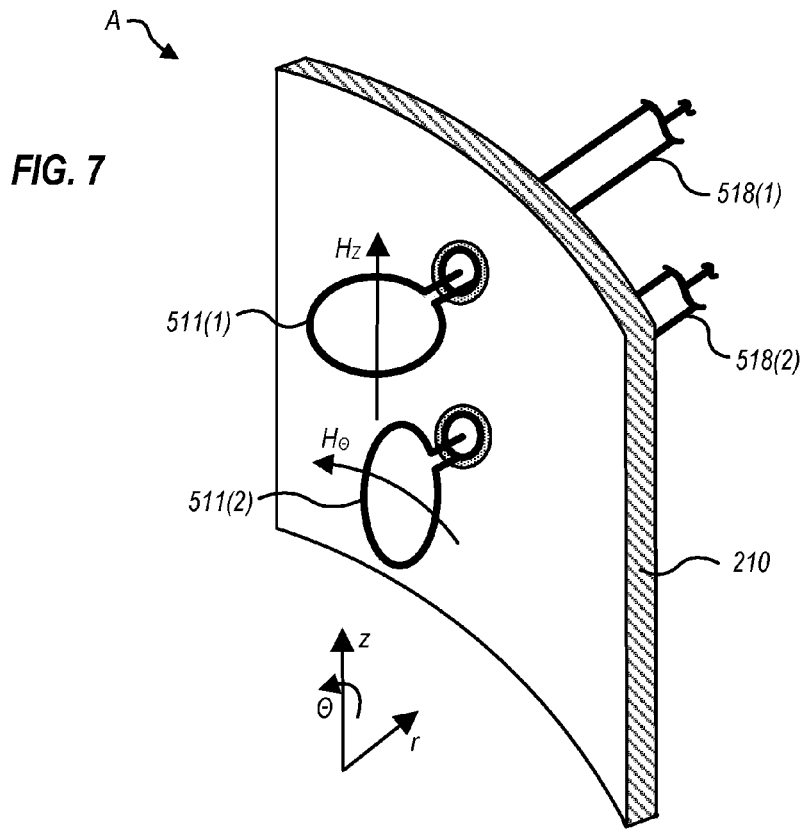
FIG. 7 is a schematic diagram of a region within the system that provides post-match control of microwaves in a radial waveguide of FIG. 6.

FIG. 7 is a schematic diagram of region A, FIG. 6. A radial direction r, azimuthal direction θ and axial direction z of a cylindrical coordinate system useful for describing the positions of antennas 511 and the directions of magnetic fields detected thereby, are shown. Monitoring antenna 511(1) includes a loop that is horizontally oriented and is thus responsive to magnetic field $H_z$. Monitoring antenna 511(2) includes a loop that is vertically oriented and is thus responsive to magnetic field $H_\theta$. Each of monitoring antennas 511(1), 511(2) connects with a respective coaxial cable 518(1) or 518(2), as shown. Cables 518(1) and 518(2) transmit signals from antennas 511(1) and 511(2) to signal controller 312, as shown in FIG. 6. Monitoring antennas 511(1) and 511(2) may be disposed relatively close to one another in order to simplify calculations of phase offsets therebetween. For example, as shown in FIG. 7, monitoring antennas 511(1) and 511(2) may be disposed atop one another in the z direction, and/or within about 3 degrees of one another in the azimuthal direction θ.

Figure 8:
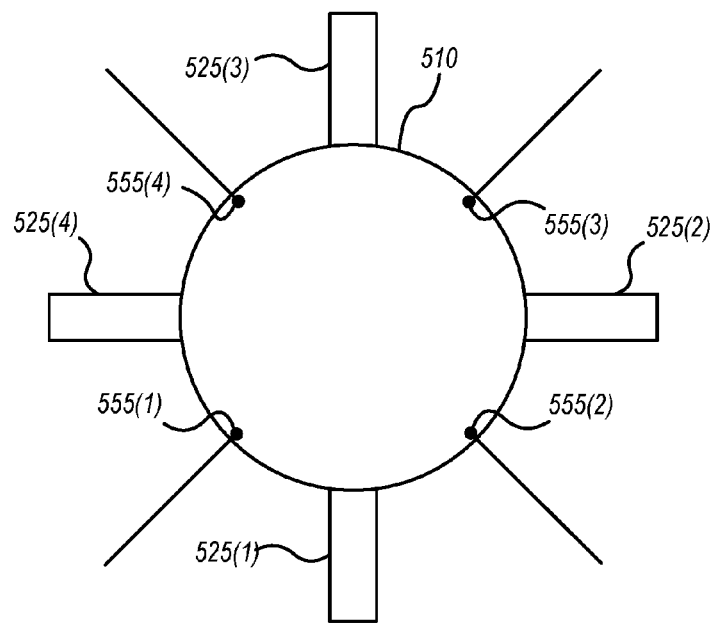
FIG. 8 schematically illustrates a radial waveguide that is powered by four electronics sets and is monitored by four monitoring antennas, in an embodiment.

Embodiments that provide post-match control of microwaves in a radial waveguide are not limited to the cases of two microwave generating electronics sets and two antennas that are illustrated in FIGS. 4-6. For example, FIG. 8 schematically illustrates a radial waveguide 510 that is powered by four electronics sets, 525(1) through 525(4) and is monitored by four monitoring antennas, 555(1) through 555(4). As shown in FIG. 8, electronics sets 525 are disposed at 90 degree intervals about a periphery of radial waveguide 510, with monitoring antennas 555 disposed at midpoints therebetween. While two monitoring antennas 555 disposed orthogonally to one another are theoretically sufficient to evaluate whether a microwave distribution within radial waveguide 510 is symmetrical, four antennas 555 and corresponding correction factors for four electronics sets 525 may be utilized to provide further degrees of freedom in process control. Electronics sets 525 are driven by a signal generator that provides four microwave signals of the same frequency but different phases (e.g., analogous to operation of dual phase signal generator 315) that receives correction factors from a quad signal controller (e.g., analogous to signal controller 312). An optional target input device (analogous to target input device 314) may provide target parameters applicable to any of the signals driven by the signal generator and/or the signals detected by any of the monitoring antennas 555. The locations of electronics sets 525 and monitoring antennas 555 shown in FIG. 8 may simplify calculation of expected phase of microwaves monitored at the monitoring antennas, and corresponding digital correction factors to be applied to the microwave signals that are input to the electronics sets, but other arrangements will be apparent to those skilled in the art. Also, similar embodiments may utilize more or fewer electronics sets 525 and/or monitoring antennas 555, with appropriate adjustments to input of target parameters and/or calculation of signals driven by a corresponding signal generator. A semiconductor processing system that includes radial waveguide 510, electronics sets 525 and monitoring antennas 555 may be optimized in a manner analogous to the procedure described above in connection with FIG. 4, except that multiple target parameters may be implemented and evaluated, alone and/or in combination with one another.

Figure 9:
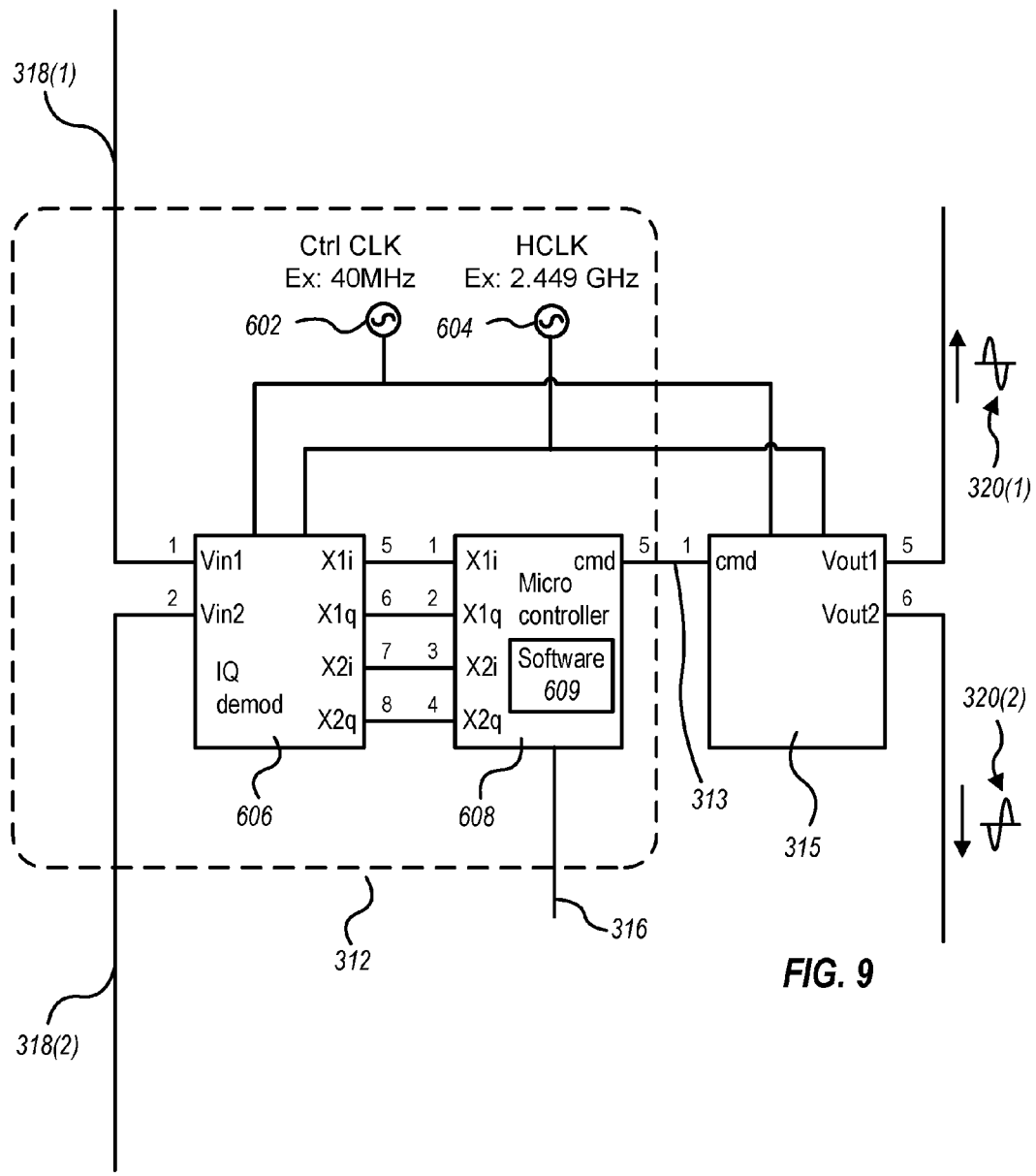
FIG. 9 is a schematic diagram illustrating implementations of the signal controller and dual phase signal generator shown in FIG. 4, in an embodiment.

FIG. 9 is a schematic diagram illustrating implementations of signal controller 312 and dual phase signal generator 315, in an embodiment. The embodiment illustrated in FIG. 9 could support any of the systems shown in FIGS. 4, 5 and 6 directly, and the principles now explained can be duplicated modified in ways that will be readily apparent to support the system illustrated in FIG. 8.

In the embodiment illustrated in FIG. 9, signal controller 312 includes a control clock (CLK) 602 that generates a 40 MHz waveform and a high frequency clock (HCLK) 604 that generates a 2.449 GHz waveform. Clock 602 serves to provide a gating time signal for successive demodulations. Clock 604 provides a reference frequency for dual phase signal generator 315 (e.g., a frequency at which radial waveguide 167, FIGS. 2A and 2B, radial waveguide 210, FIGS. 3-7 or radial waveguide 510, FIG. 8, is driven to support a plasma powered thereby) and can therefore provide the same reference frequency for IQ demodulation purposes. Given these understandings of how clocks 602 and 604 are utilized, the exact frequencies of clocks 602 and 604 are not critical and may be different in other embodiments. In particular, a higher speed of clock 602 will force more frequent repetition of the calculations discussed below, leading to faster plasma adjustment and settling times for an entire system, but will increase system power requirements and may lead to a need for higher performance versions of components 606 and 608 discussed below. A lower speed of clock 602 may increase plasma adjustment and settling time achievable by the system but may reduce system power requirements and may allow use of lower performance versions of components 606 and 608.

Signal controller 312 also includes an IQ demodulator 606 and a microcontroller 608 executing software 609. At intervals established by clock 602, an IQ demodulator 606 performs IQ demodulation of each of the signals provided through connections 318(1) and 318(2), and generates therefrom a digital in-phase signal Xni and a digital quadrature phase signal Xnq, where n is 1 or 2 corresponding to connections 318(1) and 318(2) respectively. Digital in-phase and quadrature-phase signals Xni and Xnq characterize the corresponding received signal in that Xni is the real part of signal n, and Xnq is the imaginary part of signal n. A phase φn of signal n is given by $\phi n=\tan(Xni/Xnq)$ and an amplitude An of signal n is given by $An=\sqrt{Xni^2+Xnq^2}$. The IQ demodulation of each of the signals proceeds in parallel such that for each interval, IQ demodulator 606 provides corresponding digital signals X1$i$, X1$q$, X2$i$, X2$q$, as shown.

Figure 10:
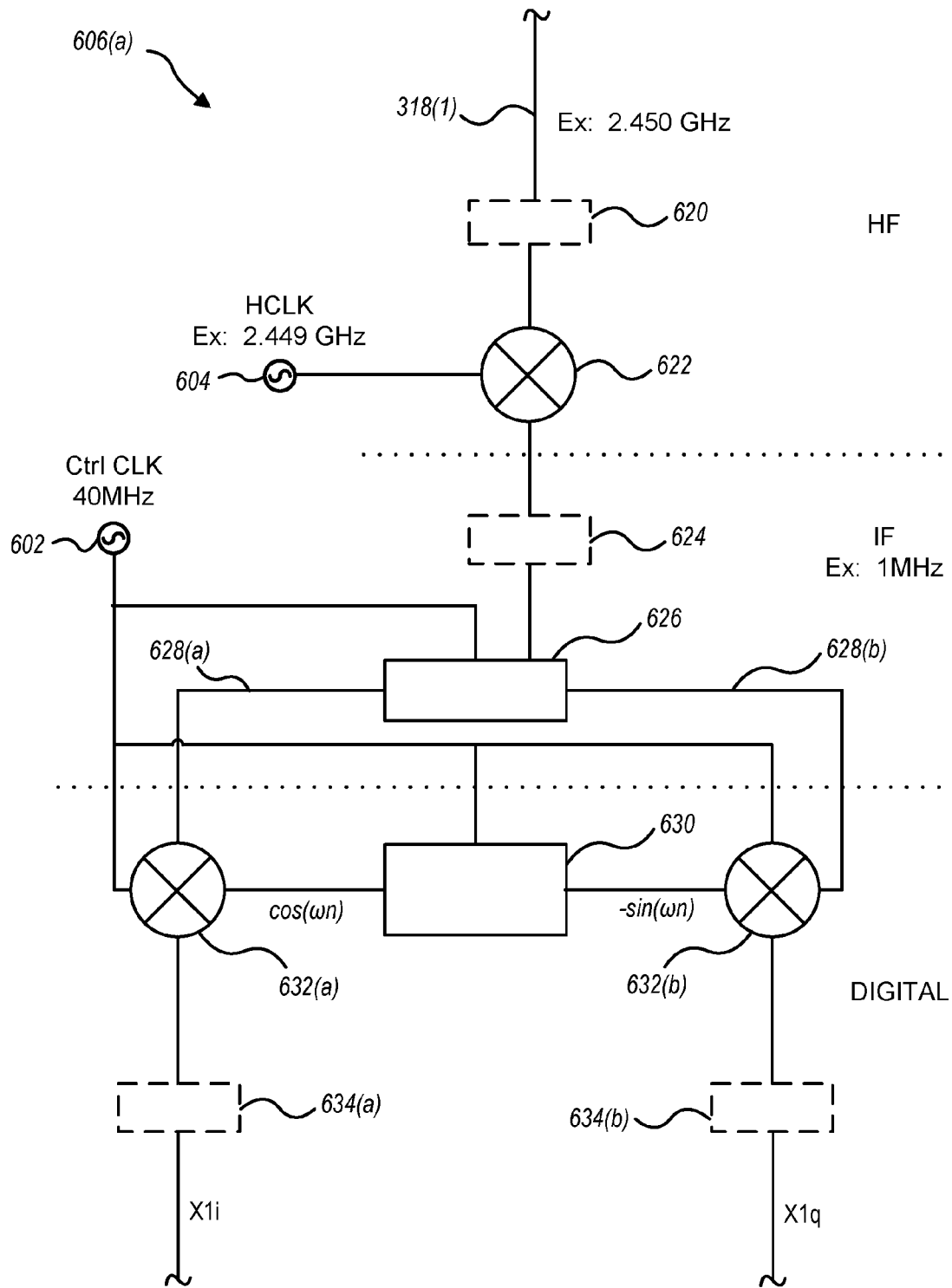
FIG. 10 illustrates exemplary operation of a first portion of an in-phase and quadrature-phase (IQ) demodulator shown in FIG. 9.

FIG. 10 illustrates exemplary operation of a first portion 606($a$) of IQ demodulator 606 that processes a signal received from connection 318(1) to yield X1$i$ and X1$q$; it is understood that IQ demodulator 606 also has a second portion that performs similar processing with respect to a signal received from connection 318(2) to yield X2$i$ and X2$q$. An optional bandpass filter 620 may be utilized to clean up the signal from connection 318, especially to eliminate harmonics of the main received frequency, which in this example is around 2.450 GHz. An exemplary passband of filter 620 might be, for example, 2.45 GHz±0.05 GHz; in embodiments, the width of the passband could be considerably higher, up to perhaps 20% of the received frequency and not necessarily centered about the received frequency. Demodulation proceeds by mixing the signal from connection 318(1) with the signal from clock 604 to generate an intermediate frequency (IF) signal. It should be understood from the discussion above and further below that the clock 604 frequency will be related to the frequency produced by signal generator 315 and propagated in radial waveguide 210 to produce a usable IF signal. In the present example clock 604 operates at 2.449 GHz while dual phase signal generator 315 produces a 2.450 GHz signal, thus yielding a 1 MHz IF signal. FIG. 10 labels parts of portion 606(a) of demodulator 606 as "HF" (high frequency), "IF" and "DIGITAL" for easy understanding of the signals being processed in each part.

In certain embodiments, in the IF part of portion 606(a) a bandpass or lowpass filter 624 cleans up the signal from mixer 622. An exemplary passband of filter 620 might be, for example, 0 Hz (if lowpass) or 0.5 MHz (if bandpass) to around 2 MHz. An analog to digital converter 626 converts the IF signal to a digital sample on intervals determined from clock 602; further processing takes place in the digital part of portion 606(a).

Copies 628(a), 628(b) of the digital sample are mixed with values corresponding to cos(ωn) and −sin(ωn), where ω is defined as $2\pi f_{IF}/f_s$, where $f_s$ is a sampling frequency of clock 602 (40 MHz in this example), $f_{IF}$ is the microwave signal frequency projected to the IF band (1 MHz in this example). The cos(ωn) and −sin(ωn) values are generated from a read-only-memory (ROM) 630 at the clock 602 sampling frequency, and are multiplied with copies 628(a), 628(b) at digital mixers 632(a), 632(b) to form the resulting digital outputs X1i and X1q.

In certain embodiments, digital low pass filters 634(a) and 634(b) can be utilized to eliminate high frequency digital noise from X1i and X1q. Typical cutoff values of digital low pass filters 634(a) and 634(b) are for example 1 kHz.

Returning to FIG. 9, from IQ demodulator 606, digital outputs X1i, X1q, X2i and X2q pass to microcontroller 608, that generates correction signal 313 therefrom. Microcontroller 608 executes software 609 (which may be stored in nontransitory, computer-readable media that forms part of microcontroller 608, or may be external to microcontroller 608) to generate correction signal 313. Software 609 is implemented to generate correction signal 313 in cooperation with operation of dual phase signal generator 315. For example, if default operation of dual phase signal generator 315 is to generate signals 320(1) and 320(2) with a phase offset of π/2, the default value of correction signal 313 may be zero; alternatively, dual phase signal generator 315 may expect correction signal 313 to completely specify a phase offset between signals 320(1) and 320(2), in which case the default value of correction signal 313 may be π/2. Also, when optional target input device 314 is implemented, microcontroller 608 receives target parameter 316 therefrom, and software 609 implements adjustments to correction signal 313 based on target parameter 316.

Dual phase signal generator 315 receives correction signal 313 from signal controller 312 (specifically, from microcontroller 608) and provides signals 320(1) and 320(2) with a phase offset indicated by correction signal 313, at two outputs Vout1 and Vout2. Dual phase signal generator 315 may include, for example, a direct digital synthesizer that generates two analog outputs, each at the nominal IF frequency discussed in connection with IQ demodulator 606, that are subsequently mixed with the signal from clock 604 to form the frequencies of signals 320. For example, in consistency with the examples above, the direct digital synthesizer would create analog outputs at 1 MHz frequency that, when mixed with the 2.449 GHz frequency of clock 604, would provide signals 320 at 2.450 GHz. Signals 320 then transmit to their respective electronics sets, as shown in each of FIGS. 4, 5 and 6, radiated into respective radial waveguides 210 and received back into connections 318(1), 318(2).

In embodiments, clock 604 may not be part of signal controller 312, but may instead be part of a signal generator (e.g., dual phase signal generator 315) which may originate the clock 604 signal and provide an output thereof to IQ demodulator 606 for use as a reference clock. Similarly, clock 602 may also be generated by a signal controller or some other part of a system that includes signal controller 312.

Figure 11:
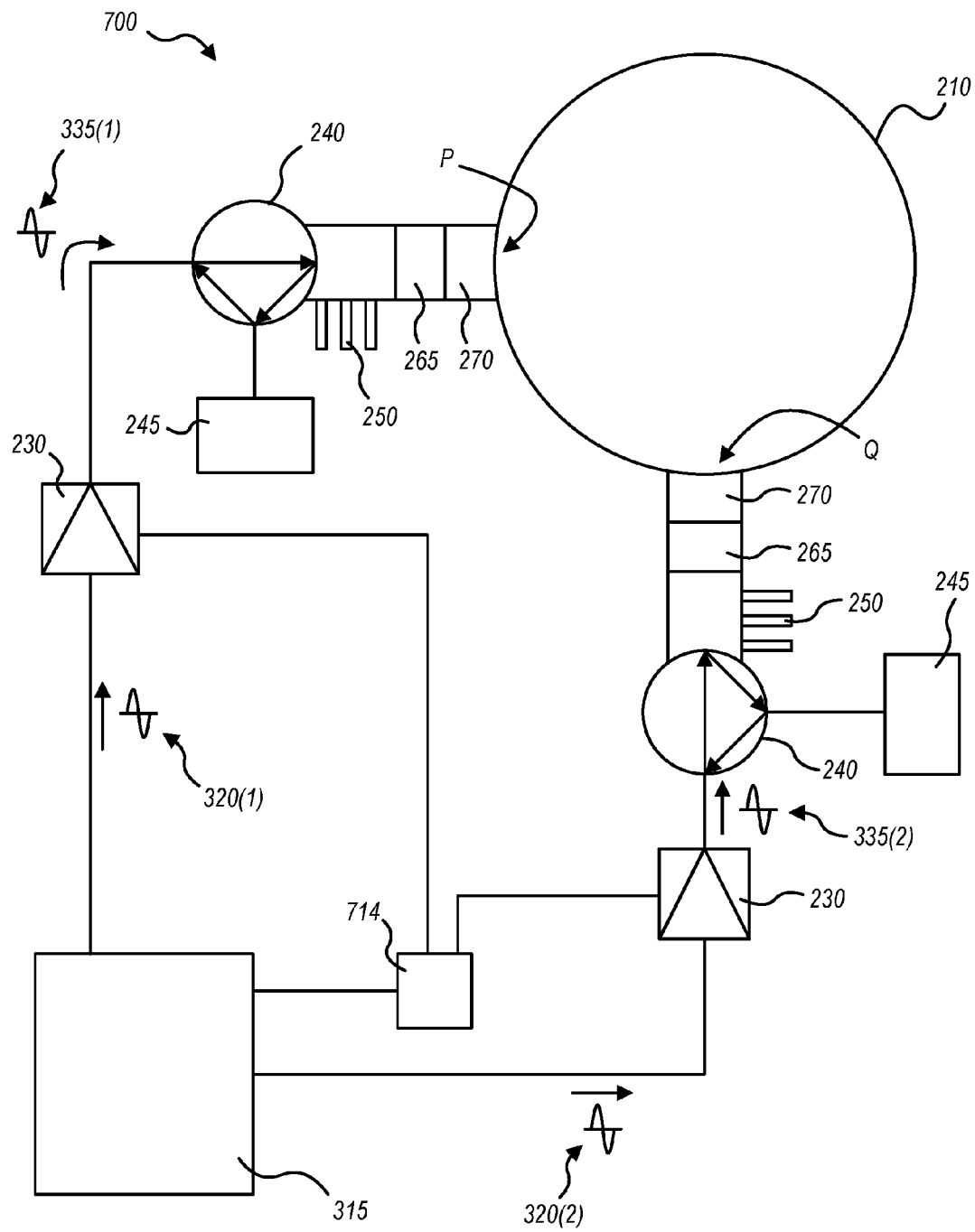
FIG. 11 is a schematic diagram of major components of a system that provides post-match control of microwaves in a radial waveguide, in an embodiment.

FIG. 11 is a schematic diagram of major components of a system 700 that provides post-match control of microwaves in a radial waveguide, in an embodiment. System 700 may be utilized, for example, to excite a plasma in an adjacent plasma chamber. In general, system 700 has many of the same components as, and works similarly to, systems 200, 300, 400 and 500 (FIGS. 3-6). However, system 700 does not include monitoring antennas or a corresponding signal controller providing feedback to signal generator 315. Instead, a target input device 714 provides an ability to provide one or more target parameters such as phase offset, amplitude adjustments, or both to signal generator 315 and/or to solid state amplifiers 230. When target input device 714 specifies a phase offset as the target parameter, the phase offset is provided by signal generator 315 in the form of a corresponding phase offset between signals 320(1) and 320(2). When input device specifies amplitude as the target parameter, the corresponding effect may be provided by signal generator 315 (e.g., in the form of amplitude(s) of signals 320(1) and/or 320(2)) or by one or both of solid state amplifiers 230 (e.g., in the form of adjusting gain of one or both of solid state amplifiers 230, so that the resulting amplitude is provided to radial waveguide 210). Whether phase or amplitude is selected as the target parameter, target input device 714 allows an operator of system 700 to optimize the selected target parameter independently of actions of tuners 250, which continue to match impedance.

It should be understood that an ability to set and/or adjust gain of solid state amplifiers 230 as shown in FIG. 11 may also be utilized in embodiments wherein antennas provide feedback and a signal controller adjusts phase and/or amplitude based on the feedback, (e.g., systems 300, 400 and 500 (FIGS. 4-6)).

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A system that controls microwaves in a radial waveguide, comprising:
   the radial waveguide;
   a plurality of electronics sets, wherein each electronics set:
      receives and amplifies an input microwave signal having a frequency, a phase and an amplitude, to form an amplified microwave signal, and
      transmits the amplified microwave signal into a respective location of the radial waveguide,
      wherein the frequencies of the input microwave signals received by each of the plurality of electronics sets are the same;
   at least one monitoring antenna within the radial waveguide that provides an analog signal responsive to microwaves at a location of the monitoring antenna; and
   a controller that receives the analog signal, and in response to the analog signal, adjusts at least one of the phase and the amplitude of the input microwave signal provided to one or more of the plurality of electronics sets, to achieve a predetermined condition at the location of the monitoring antenna.

2. The system as recited in claim 1, wherein in response to the analog signal, the controller that receives the analog signal adjusts both the phase and the amplitude of the input microwave signal provided to one or more of the plurality of electronics sets, to achieve the predetermined condition.

3. The system as recited in claim 1, further comprising:
   a target input device configured to provide a target parameter to the controller;
   and wherein:
   the controller adjusts the at least one of the phase and the amplitude of the input microwave signal based on the analog signal and the target parameter.

4. The system as recited in claim 1, wherein a first one of the electronics sets includes:
   a tuner that matches an impedance of a first one of the amplified microwave signals to an impedance presented by the radial waveguide;
   a dummy load; and
   a circulator that shunts power reflected by the radial waveguide back to the first one of the electronics sets, into the dummy load.

5. The system as recited in claim 4, wherein the controller adjusts the at least one of the phase and the amplitude of the input microwave signal, and the tuner matches the impedance, concurrently with one another.

6. The system as recited in claim 1, wherein the monitoring antenna is disposed proximate to the location at which at least one of the electronics sets transmits the amplified microwave signal into the radial waveguide.

7. The system as recited in claim 1,
comprising at least two of the monitoring antennas that provide respective ones of the at least one analog signal responsive to microwaves at respective locations of each of the monitoring antennas; and wherein
the controller receives the respective analog signals and adjusts at least the at least one of the phase and the amplitude of the input microwave signal provided to one or more of the plurality of electronics sets, to achieve the predetermined condition at the respective locations of each of the monitoring antennas.

8. The system as recited in claim 7, wherein:
   a first one of the monitoring antennas is disposed 90 degrees about a circumference of the radial waveguide from the location at which a first one of the electronics sets transmits a first one of the amplified microwave signals into the radial waveguide; and
   a second one of the monitoring antennas is disposed 90 degrees about the circumference of the radial waveguide from the location at which a second one of the electronics sets transmits a second one of the amplified microwave signals into the radial waveguide.

9. The system as recited in claim 1, wherein the monitoring antenna comprises a loop antenna that measures a magnetic field to provide the analog signal.

10. The system as recited in claim 1, further comprising a signal generator that provides the input microwave signals, wherein:
    the controller adjusts at least the at least one of the phase and the amplitude of the input microwave signal provided to the one or more of the plurality of electronics sets to achieve the predetermined condition by providing a digital correction signal to the signal generator, and
    the signal generator adjusts the at least one of the phase and the amplitude of the input microwave signal to one of the electronics sets relative to at least one of the phase and the magnitude of the input microwave signal to another one of the electronics sets, in response to the digital correction signal.

11. A system that controls microwaves in a radial waveguide, comprising:
    the radial waveguide;
    a plurality of electronics sets, wherein each electronics set:
       receives and amplifies an input microwave signal having a frequency, a phase and an amplitude, to form an amplified microwave signal, and
       transmits the amplified microwave signal into a respective location of the radial waveguide,
       wherein the frequencies of the input microwave signals received by each of the plurality of electronics sets are the same;
    at least one monitoring antenna within the radial waveguide that provides an analog signal responsive to microwaves at a location of the monitoring antenna; and
    a controller that receives the analog signal, and in response to the analog signal, adjusts at least one of the phase and the amplitude of the input microwave signal provided to one or more of the plurality of electronics sets, to achieve a predetermined condition at the location of the monitoring antenna;
    wherein the controller comprises:
    a high frequency clock generator that produces a high frequency reference signal;
    a control clock generator that produces a low frequency control signal;

an in-phase and quadrature-phase demodulator that produces a first digital in-phase signal Xi and a first digital quadrature phase signal Xq from the analog signal; and a microcontroller that generates a correction signal based at least in part on Xi and Xq, the correction signal specifying adjustment information that, when utilized by the system to adjust the at least one of the phase and the amplitude of the input microwave signal provided to one or more of the plurality of electronics sets, produces one or more changes in the analog signal toward the predetermined condition.

12. A signal corrector that provides a correction signal for a microwave apparatus that transmits microwaves at a common frequency into a microwave chamber from at least two locations, the correction signal specifying an adjustment for the microwaves so as to correct at least one analog signal received from a location within the microwave chamber toward a predetermined condition, the signal corrector comprising:

a high frequency clock generator that produces a high frequency reference signal;

a control clock generator that produces a low frequency control signal;

an in-phase and quadrature-phase demodulator that produces a first digital in-phase signal Xi and a first digital quadrature phase signal Xq from the at least one analog signal; and a microcontroller that generates the correction signal based at least in part on Xi and Xq, the correction signal specifying adjustment information that, when utilized by the microwave apparatus to adjust at least one of a phase and an amplitude of the microwaves transmitted into the microwave chamber from at least one of the locations, produces one or more changes in the at least one analog signal toward the predetermined condition.

13. The signal corrector of claim 12, wherein the in-phase and quadrature-phase demodulator produces the first digital in-phase signal Xi and the first digital quadrature phase signal Xq from the at least one analog signal by:

mixing the analog signal with the high frequency reference signal to produce an intermediate frequency signal;

converting the intermediate frequency signal to a digital sample at intervals determined from the low frequency control signal;

producing Xi by multiplying the digital sample with a first value obtained from a read-only memory, and producing Xq by multiplying the digital sample with a second value obtained from the read-only memory.

14. The signal corrector of claim 13, wherein:

the first value obtained from the read-only memory corresponds to $\cos(\omega n)$, where $\omega$ is defined as $2\pi f_{IF}/f_s$, where $f_s$ is a sampling frequency of the low frequency control signal and $f_{IF}$ is a frequency of the intermediate frequency signal; and the second value obtained from the read-only memory corresponds to $-\sin(\omega n)$.

15. The signal corrector of claim 12, further comprising a low pass filter that is used to eliminate high frequency digital noise from at least one of Xi and Xq.

16. The signal corrector of claim 12, further comprising an input target device that provides information of the predetermined condition to the microcontroller.

17. The signal corrector of claim 12, wherein the microcontroller provides phase adjustment information for the microwaves based at least in part on Xi and Xq.

18. The signal corrector of claim 12, wherein the microcontroller provides amplitude adjustment information for the microwaves based at least in part on Xi and Xq.

19. The signal corrector of claim 12, further comprising at least one antenna that generates the at least one analog signal at the location within the microwave chamber.

20. The signal corrector of claim 12, wherein the in-phase and quadrature-phase demodulators produce the first digital in-phase signal Xi and the first digital quadrature phase signal Xq from the at least one analog signal, and the microcontroller that generates the correction signal based at least in part on Xi and Xq, concurrently with electronics sets of the microwave apparatus tuning the microwaves as they are transmitted into the microwave chamber.

* * * * *